United States Patent [19]

Hoffmann

[11] 4,082,963
[45] Apr. 4, 1978

[54] REGENERATING AMPLIFIER FOR CCD ARRANGEMENTS

[75] Inventor: Kurt Hoffmann, Taufkirchen, Germany

[73] Assignee: Siemens Aktiengesellschaft, Berlin & Munich, Germany

[21] Appl. No.: 717,703

[22] Filed: Aug. 25, 1976

[30] Foreign Application Priority Data

Sep. 3, 1975 Germany ................................ 2539205

[51] Int. Cl.² ...................... H01L 29/78; G11C 19/28
[52] U.S. Cl. .............................. 307/221 D; 307/264; 307/304; 307/DIG. 1; 307/DIG. 3; 357/24
[58] Field of Search .............. 307/221 C, 221 D, 264, 307/304, DIG. 4, DIG. 3, DIG. 1; 357/24

[56] References Cited

U.S. PATENT DOCUMENTS

| 3,623,132 | 11/1971 | Green ...................... 307/DIG. 3 X |
| 3,876,989 | 4/1975 | Bankowski et al. ......... 307/221 D X |
| 3,900,743 | 8/1975 | Weimer .......................... 307/221 D |
| 3,947,698 | 3/1976 | Cheek, Jr. et al ............. 307/221 D |
| 3,986,059 | 10/1976 | Mohsen ....................... 307/221 D X |

OTHER PUBLICATIONS

Dennard, "Regeneration Circuit for Charge-Coupled Device Shift Registers;" *IBM Tech. Discl. Bull.*, vol. 14, No. 12, pp. 3791–3792, 5/1972.
Dennard et al., "Read/Write Amplifier for Charge-Coupled Device Memory," *IBM Tech. Discl. Bull.;* vol. 14, No. 12, pp. 3722–3723, 5/1972.
Terman, "Charge-Coupled Device Shift Register Read/Write/Regeneration Circuit;" *IBM Tech. Discl. Bull.;* vol. 14, No. 12, pp. 3784–3785; 5/1972.
Ibrahim et al., "4096-BIT CCD Serial Memory Array;" 1973 *Int'l Electron Devices Meeting, Technical Digest*, pp. 141–143; 12/1973.

*Primary Examiner*—Larry N. Anagnos
*Attorney, Agent, or Firm*—Hill, Gross, Simpson, Van Santen, Steadman, Chiara & Simpson

[57] ABSTRACT

Regenerating amplifier for use with charge coupled devices comprising a pair of diode-coupled transistors connected to an output terminal of one charge coupled device, two capacitances, and means for precharging said two capacitances. One of the capacitances is a parasitic capacitance, the other of which is the input capacitance of the second charge coupled device. The charge is transferred from the output terminal of the first charge coupled device by discharging one precharged capacitor and thus discharging or not discharging the second capacitance at the input to the second charge coupled device, depending upon the binary state of the data being transferred.

4 Claims, 11 Drawing Figures

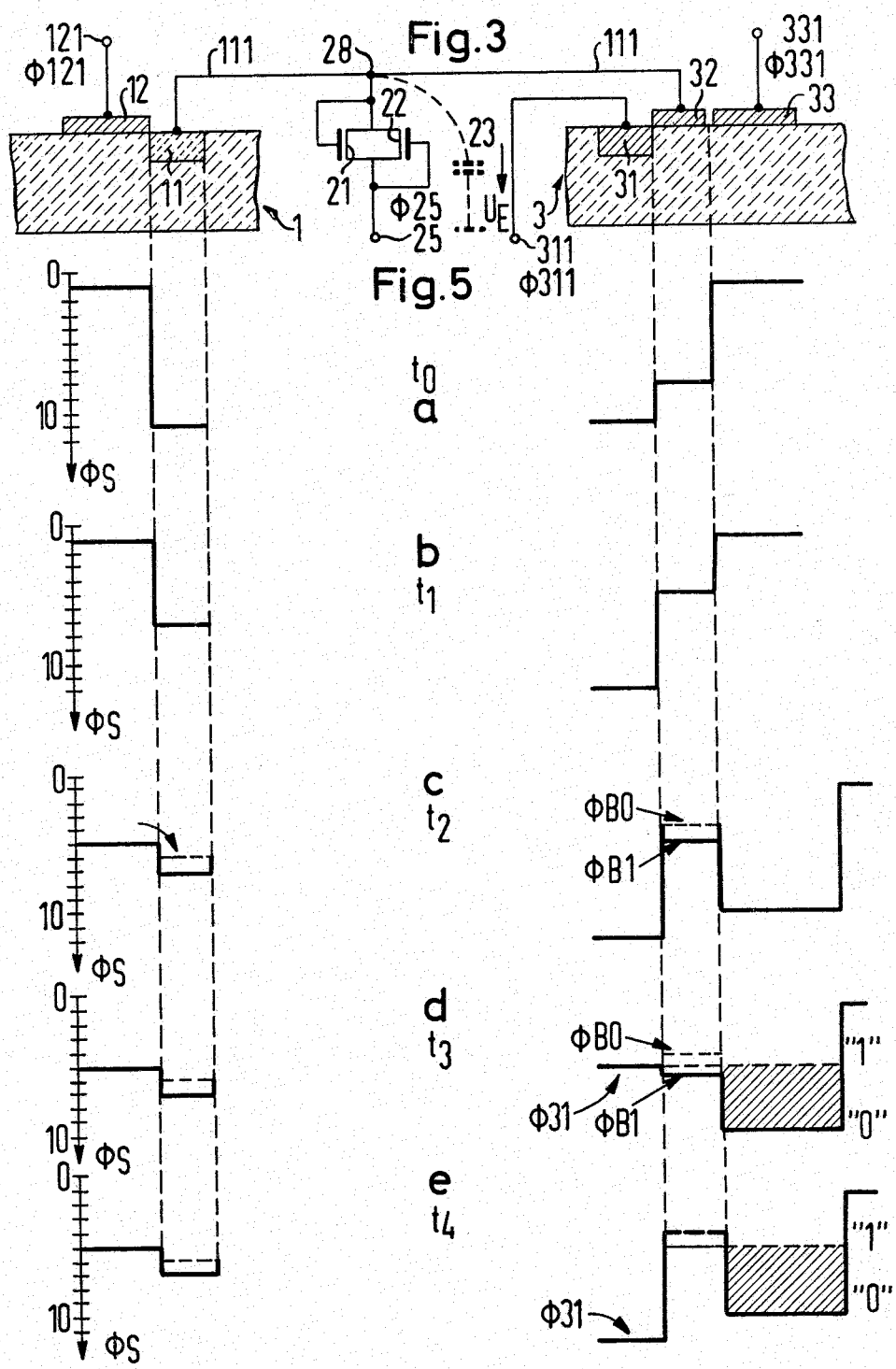

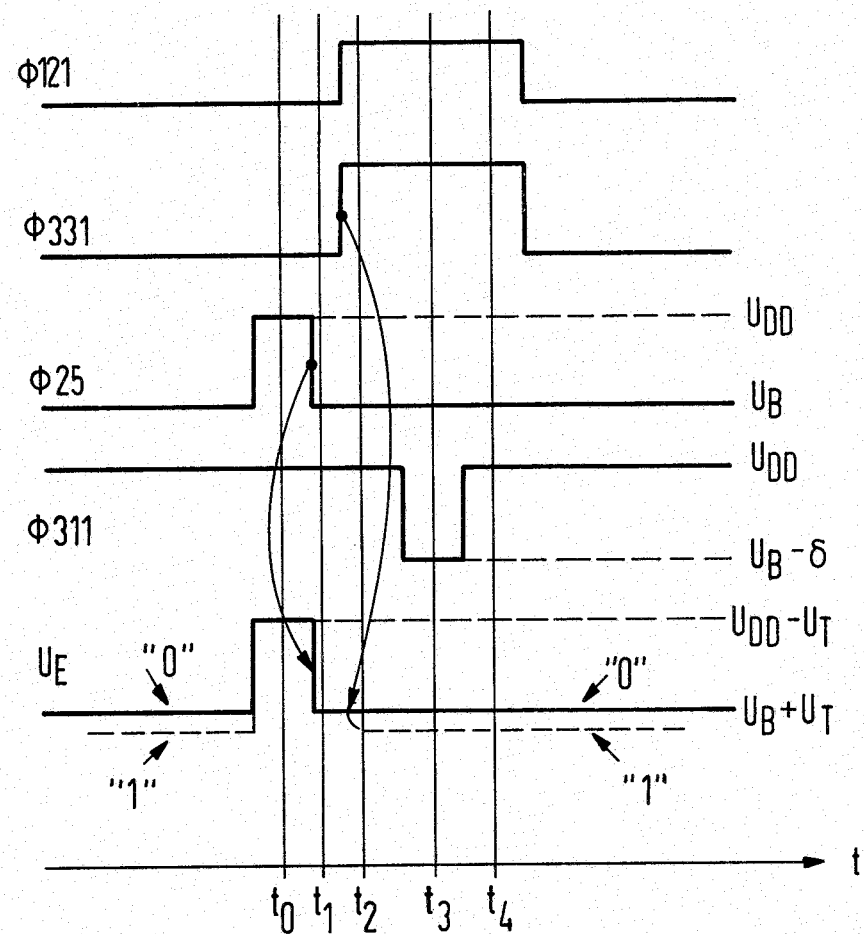

ically illustrates a layout for a
REGENERATING AMPLIFIER FOR CCD ARRANGEMENTS

BACKGROUND OF THE INVENTION

This invention relates to a regenerating amplifier for charge-coupled-device arrangements (CCD arrangements).

In CCD arrangements which operate without a basic charge, at short intervals regenerating amplifiers are required, the surface space requirement of which must be as small as possible. In addition, these amplifiers should be insensitive to start voltage fluctuations and supply voltage fluctuations.

SUMMARY OF THE INVENTION

It is the purpose of this invention to provide a regenerating circuit for a CCD arrangement whose space requirement is small and which amplifies the change in voltage of a capacitance which has been pre-charged to a reference voltage. This objective is achieved by a regenerating circuit of the type hereinafter to be described.

A fundamental advantage of the invention consists in that the reference voltage is produced in such a manner that effects of changes in the start voltage and in the supply voltage are eliminated. Also, the amplifier transistor is advantageously biased in such a manner that it possesses a maximum amplification.

In the following, the invention will be explained in detail making reference to the description and the Figures.

BRIEF DESCRIPTION OF THE DRAWINGS

FIG. 3 schematically illustrates the interconnection of a dynamic amplifier in accordance with the invention and two CCD arrangements;

FIG. 4 shows a time chart of the circuit of FIG. 3;

FIGS. 5a to 5e show the surface potentials which occur at the individual points of the two CCD arrangements at different times.

DESCRIPTION OF THE PREFERRED EMBODIMENTS

Figure 1:
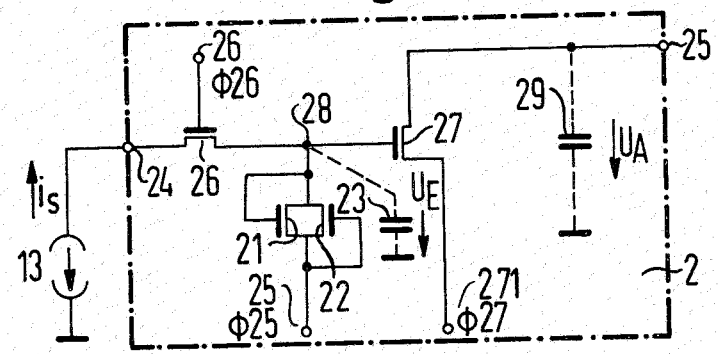
FIG. 1 shows a circuit diagram of a dynamic amplifier in accordance with the invention.

The illustrated embodiment of a regenerating amplifier 2 embodying the teachings of the present invention is illustrated in FIG. 1. The amplifier 2 has an input terminal 24 and an output terminal 25'. The amplifier 2 includes a transistor 26 which can be controlled by the potential $\phi 26$ connects the input 24 to the gate of transistor 27 at the connection point 28. The transistors 21 and 22 serve to produce a reference voltage across the capacitance 23. For this purpose, these transistors 21 and 22 have their source terminals connected together, and they also have their drain terminals connected to each other, as shown in the drawing. In this way, these transistors act as opposingly connected diodes. The gate terminal of the transistor 22 is connected to the point 25, which is connected to a potential $\phi 25$, from which the reference voltage is produced. The gate terminal of the transistor 21 is connected to the point 28. The transistor 27 connects the output terminal 25 to the terminal 271, to which the potential $\phi 27$ is connected. The current sink 13, which is connected to the input 24, represents the binary states "1" and "0" by the presence and absence of a current $I_s$. As will be described in detail further in the description, this current sink represents the output of the CCD arrangement.

Figure 2:
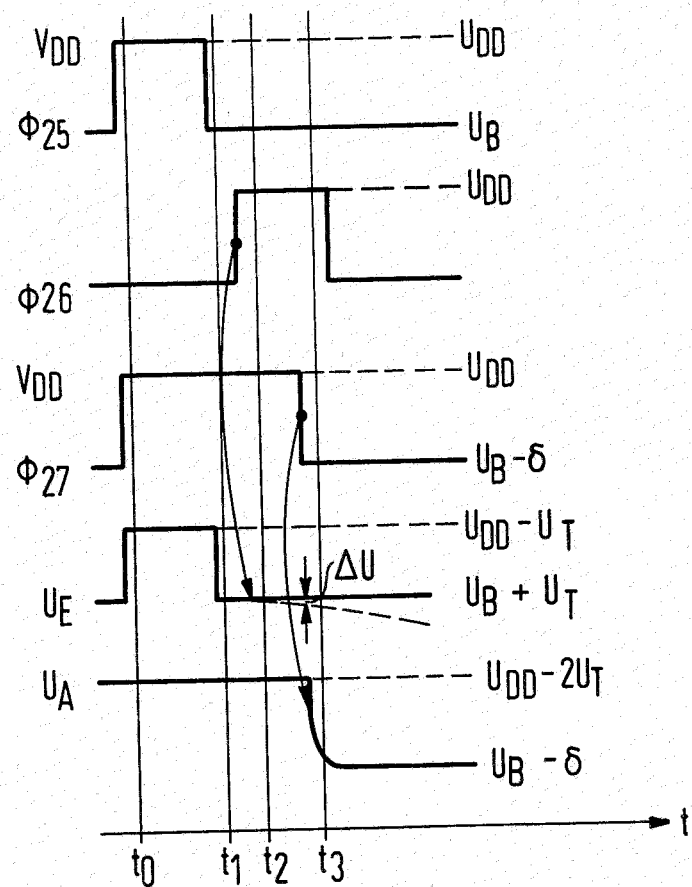
FIG. 2 shows a time diagram for the operation of the dynamic amplifier shown in FIG. 1.

In the following, the mode of functioning of the dynamic regenerating amplifier in accordance with the invention will now be described, making reference to FIGS. 1 and 2. At the time $t_0$, the control signals $\phi 25$ and $\phi 27$ have a voltage of $U_{DD}$, as a result of which the parasitic capacitance 23 is biased via the transistor 22 to a voltage of $U_{DD} - U_T$ and the parasitic capacitance 29 is biased to a voltage of $U_{DD} - 2 U_T$. Here $U_T$ signifies the start voltage of the transistors 22 and 27. At the time $t_1$ the control signal $\phi 25$ has a voltage of $U_B$ as a result of which the capacitor 23 is recharged to a voltage of $U_B + U_T$ with the aid of the transistor 21. The transistor 22 is then blocked. The voltage across the capacitor 29 here remains unchanged. When the transistor 26 has been switched on at the time $t_2$, the capacitor 23 is discharged or is not discharged, in accordance with the binary state of the current sink 13. At the time $t_3$ the control signal $\phi 27$ has a voltage of $U_B - \delta$.

If the capacitor 23 has not been discharged, a voltage of $U_E - \phi 27 = (U_B + U_T) - (U_B - \delta) = U_T + \delta$ is connected between gate and source of the transistor 27. As this voltage exceeds the start voltage $U_T$ by the amount of $\delta$, the transistor 27 goes conductive, as a result of which the capacitance 29 is discharged to a voltage of $U_A = U_B - \delta$.

If, on the other hand, the capacitor 23 has been discharged by an amount of $\Delta U$, a voltage of $U_E - \phi 27 = (U_B + U_T) - \Delta U - (U_B - \delta) = U_T - \Delta U + \delta$ can be noted between the gate and the source of the transistor 27. If it is assumed that $\Delta U$ is greater than $\delta$, the transistor 27 is non-conductive, and the capacitor 29 retains the voltage of $U_A = U_{DD} - 2 U_T$.

Thus, we have, (1) for $\Delta U = 0$, an output voltage of $U_A = U_B - \delta$, and (2) for $\Delta U > \delta$ an output voltage of $U_A = U_{DD} - 2 U_T$.

As the magnitude of the output voltage $U_A = U_B - \delta$, or $U_{A = UDD} - 2 U_T$ is dependent only upon $\Delta U$, fluctuations in voltage supply and start voltage advantageously have no influence on the function of the dynamic regenerating amplifier in accordance with the invention.

The voltage change $\Delta U$ can be calculated or predetermined for the various cases of use, so that the voltage can be predetermined and thus the pulse generation circuits for $\phi 25$ and $\phi 27$ can be integrated on the same chip.

In the following, the use of the dynamic regenerating amplifier as a regenerating stage in CCD registers, will be described in association with FIGS. 3, 4 and 5.

FIG. 3 illustrates the use of the dynamic regenerating amplifier shown in FIG. 1 as a regenerating stage for the CCD arrangement without a basic charge generation. Details of FIG. 3 which have already been described in association with the other Figures bear the corresponding references. The last electrode 12 of the CCD output stage 1 here assumes the function of the transistor 26 and that of the current sink 13 in FIG. 1, whereas the transistor 27 in FIG. 1 represents the input stage of the CCD arrangement 2 with the diffusion zone 31 and the gate electrode 32. The capacitance 29 is governed by a potential well located beneath the electrode 33.

The regeneration of the CCD output signals of the CCD citcuit 1 will now be explained with the aid of the time diagram shown in FIG. 4, and the associated surface potentials $\phi$ 5 shown in FIGS. 5a to 5e. At the time $t_0$ (FIG. 5a) the capacitance 23 is biased to the voltage $U_{DD} - U_T$. When the signal $\phi$ 25 has been reduced to a voltage of $U_B$ (time $t_2$, FIG. 5b), the gate voltages $\phi$ 121 and $\phi$ 331 are connected to the gate electrodes 12 and 33. To avoid electrons from passing from the diffusion zone 11 into the potential well beneath the electrode 12, the gate voltage $\phi$ 121 has a value which produces a surface potential which is smaller than that of the diffusion zone 11. If electrons representing a binary "1" reach the output diffusion zone 11, the parasitic capacitance 23 composed of the capacitance of the diffusion zone 11 and the parasitic capacitances of the transistors 21, 22 and of the capacitance of the electrode 32, is discharged. If, at the time $t_2$, no electrons (binary "0") reach the output diffusion zone 11, the voltage $U_E = U_{DD} - U_T$ remains unchanged. As can be seen from FIG. 5c, a potential well exists beneath the electrode 32 and a potential barrier with a surface potential of $\phi_B$ exists beneath the electrode 32. This surface potential has a value of $\phi_B = \phi_{B1}$ or $\phi_B = \phi_{B0}$, in dependence upon whether charge or no charge reaches the diffusion zone. At the time $t_3$ (FIG. 5d), the diffusion zone 31 is pulsed with the aid of the signal voltage $\phi$ 311 to a voltage of $U_B - \delta$, as a result of which it assumes a surface potential of $\phi_{31}$. If $\phi_{31} > \phi_B$, i.e., $\phi_B = \phi_{B1}$, charge carriers pass from the diffusion zone into the potential well.

Otherwise, when $\phi_{31} < \phi_B$ and $\phi_B = \phi_{E0}$, no charge carriers can pass into the potential well. At the time $t_4$, the signal voltage $\phi$ 311 again has a value of $U_{DD}$, as a result of which the surface potential $\phi$ 31 is of sufficient magnitude for the diffusion zone to be cut off from the potential well (FIG. 5e).

Figure 6:
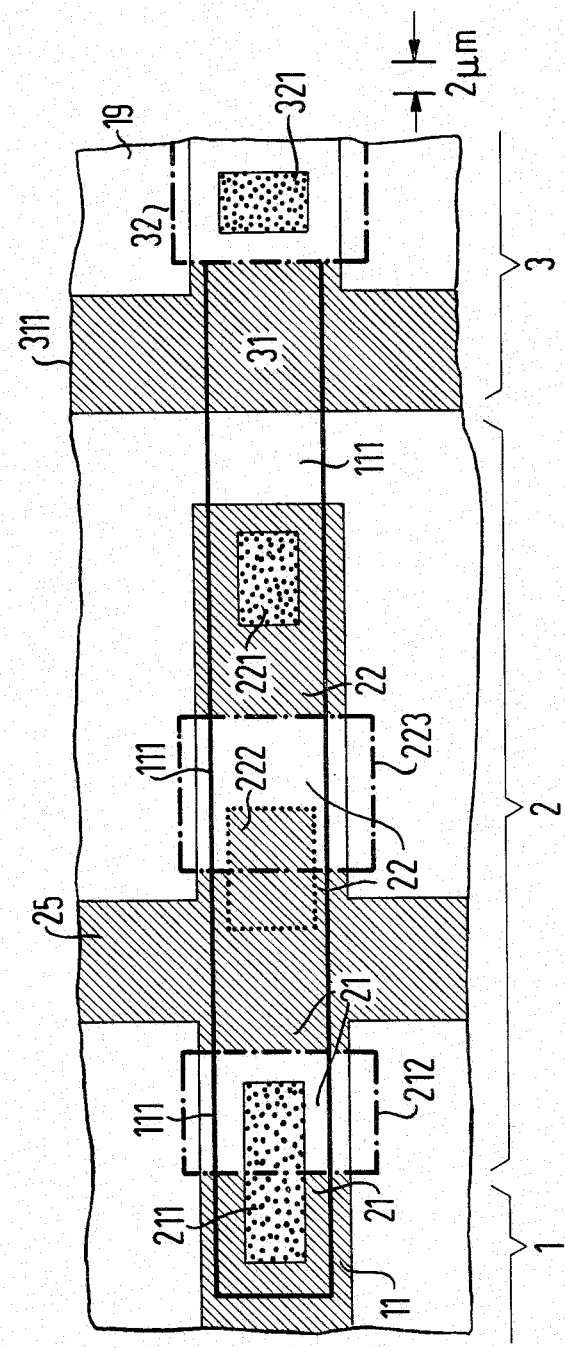
FIG. 6 diagrammatically illustrates a layout for a CCD regenerating amplifier embodying the present invention.

FIG. 6 illustrates the construction of the CCD regenerating amplifier of FIG. 3 in a silicon-gate-technique. Details of FIG. 6 which have already been described in association with FIG. 3 bear the corresponding references. The CCD circuit 1, the regenerating amplifier 2 of the invention, and the CCD circuit 3 are constructed on a substrate 19. This substrate is preferably a p-conducting silicon substrate. The n-diffusion zones represented by obliquely shaded areas are introduced into this substrate. The n-diffusion zone 11 of the CCD arrangement 1 simultaneously serves as source zone of the transistor 21. The n-doped drain zone of this transistor simultaneously represents the terminal 25 and the drain terminal of the transistor 22. The source zone of the transistor 22 is connected via the contact hole 221 outlined by the dotted area 221, to the aluminum line 111 and thus via the contact hole 211 to the diffusion zone 11 and to the source zone of the transistor 21. The silicon gate electrode, indicated by the dash-dotted line 212 of the transistor 21, is likewise connected via the contact hole 211 to the aluminum conductor path 111. The silicon gate electrode, represented by the dash-dotted line 223, of the transistor 22 is electrically connected via the diffusion silicon gate contact 22, arranged next to the n-diffusion zone 31, of the CCD arrangement 3 is connected to the aluminum conductor path 111 via the contact hole 321 shown by the dotted area. The electrode 32 is likewise a silicon electrode which is represented by the dash-dotted line.

It will be apparent to those skilled in the art that many modifications and variations may be effected without departing from the spirit and scope of the novel concepts of the present invention.

I claim as my invention:

1. Regenerating amplifier, in particular for use in CCD registers, comprising a first and a second transistor cross-connected to one another, two source (or drain) terminals of these transistors connected to one another, and the two drain (or source) terminals of these transistors being connected to one another, the gate terminal of the first transistor being connected to the drain (or source) terminals of the two transistors, and the gate terminal of the second transistor being connected to the two source (or drain) terminals of the two transistors, a first point at which the two source (or drain) terminals are connected to one another being connected via a third transistor to the input of said regenerating amplifier, said third transistor being controllable via its gate terminal, a second point at which the drain (or source) terminals of the first two transistors are combined representing a terminal to which a pulse train can be connected to said second point, said first point being connected to the gate terminal of a fourth transistor, the source (or drain) terminal of the fourth transistor being connected to the output of said regenerating amplifier, the drain (or source) terminal of said fourth transistor being connected to a terminal to which a timing potential may be connected, said first point being connected to a capacitance, and the output being connected to a second capacitance.

2. Regenerating amplifier as set forth in claim 1, in which said regenerating amplifier is constructed on a p type silicon substrate using a silicon-gate technique in which said diffusion zone is an n type diffusion zone which simultaneously represents the source (or drain) terminal of said second transistor and in which another n type diffusion zone simultaneously represents the drain (or source) zone of said second transistor, said output terminal and said drain (or source) zone of said first transistor, and in which a further n type diffusion zone represents the source (or drain) terminal of said first transistor and in which silicon-gate electrodes, arranged above the zones between the source (and drain) zones of said first and second transistors, are separated from the substrate by an insulating layer and in which an aluminum conductor path is arranged above said silicon electrodes separated from the latter by an insulating layer, said aluminum conductor path being electrically connected through contact holes to said silicon electrode of said CCD arrangement, and said n type diffusion zone being arranged in said semiconductor substrate of said CCD arrangement next to said silicon electrode and laterally forms a terminal to the exterior.

3. Regenerating amplifier as set forth in claim 1, in which when used in CCD registers, said point is connected to a diffusion zone of a CCD arrangement having a first and second CCD, said diffusion zone represents the drain (or source) terminal of a transistor, said point being connected to an electrode of said second CCD, where said electrode represents the gate electrode of a transistor, the diffusion zone being arranged next to said electrode in said semiconductor substrate or said CCD arrangement being the drain (or source) terminal of this transistor, which is connected to a terminal via which the timing potential may be connected, said capacitance being a parasitic capacitance, which is composed of the capacitance of the diffusion zone of said first CCD and of the parasitic capacitance of the first and second transistors and of the capacitance of said gate electrode of a CCD, and a second capacitance being governed by the potential well which is located beneath an electrode of said second CCD arrangement.

4. Regenerating amplifier adapted particularly for use in CCD registers comprising a first and a second FET connected with their source terminals electrically connected to one another and their drain terminals electrically connected to one another, the gate terminal of a first one of said FETs being connected to said drain (or source) terminals of said first and second FETs forming a first node and the gate terminal of the second one of said FETs being connected to said source (or drain) terminals of said first and second FETs, forming a second node, a first charge coupled device having a gate terminal controlling the flow of charges therefrom, a second charge coupled device having a gate terminal controlling the flow of charges thereto, said first node being connected to the output end of said first charge coupled device, said first charge coupled device forming a curent sink for said amplifier, being connected between said amplifier input terminal and a reference potential, said first charge coupled device being controlled through its gate terminal, means for connecting a pulse train to said second node, said second charge coupled device being connected between an output terminal and a clock pulse potential terminal, the gate of said second charge coupled device being connected to said first node, and a capacitance connected between said first node and said reference potential, and a capacitor connected between said output terminal and said reference potential.

* * * * *

UNITED STATES PATENT OFFICE
CERTIFICATE OF CORRECTION

Patent No. 4,082,963              Dated April 4, 1978

Inventor(s) Kurt Hoffmann

It is certified that error appears in the above-identified patent and that said Letters Patent are hereby corrected as shown below:

On the Cover sheet, "4 Claims, 11 Drawing Figures" should read --- 4 Claims, 10 Drawing Figures ---.

In the Drawings:

Sheet 2 should have the indicia "Fig. 5" placed in front of each of the letters a, b, c, d, and e, and should have the term "Fig. 5" deleted from above the column of letters a, b, c, d and e.

Signed and Sealed this

Fifth Day of December 1978

[SEAL]

Attest:

RUTH C. MASON
Attesting Officer

DONALD W. BANNER
Commissioner of Patents and Trademarks